(12) United States Patent
Roig Guitart et al.

(10) Patent No.: US 9,324,784 B2
(45) Date of Patent: Apr. 26, 2016

(54) ELECTRONIC DEVICE HAVING A TERMINATION REGION INCLUDING AN INSULATING REGION

(71) Applicant: Semiconductor Components Industries, LLC, Phoenix, AZ (US)

(72) Inventors: Jaume Roig Guitart, Oudenaarde (BE); Zia Hossain, Tempe, AZ (US); Peter Moens, Zottegrm (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 97 days.

(21) Appl. No.: 14/249,677

(22) Filed: Apr. 10, 2014

(65) Prior Publication Data

US 2015/0295025 A1  Oct. 15, 2015

(51) Int. Cl.
| | | |
|---|---|---|
| H01L 29/66 | (2006.01) | |
| H01L 29/06 | (2006.01) | |
| H01L 29/36 | (2006.01) | |
| H01L 29/40 | (2006.01) | |
| H01L 29/78 | (2006.01) | |

(52) U.S. Cl.
CPC ............ *H01L 29/0634* (2013.01); *H01L 29/06* (2013.01); *H01L 29/36* (2013.01); *H01L 29/40* (2013.01); *H01L 29/402* (2013.01); *H01L 29/7811* (2013.01); *H01L 29/7813* (2013.01)

(58) Field of Classification Search
CPC ..................................................... H01L 29/404
USPC ....................................................... 257/488
See application file for complete search history.

(56) References Cited

U.S. PATENT DOCUMENTS

| | | | |
|---|---|---|---|
| 5,639,676 A | 6/1997 | Hshieh et al. | |
| 6,204,097 B1 | 3/2001 | Shen et al. | |
| 6,274,904 B1 | 8/2001 | Tihanyi | |
| 6,300,171 B1 | 10/2001 | Frisina | |
| 6,388,286 B1 | 5/2002 | Baliga | |
| 6,573,558 B2 * | 6/2003 | Disney .................. | H01L 29/402 257/300 |
| 6,621,122 B2 | 9/2003 | Qu | |

(Continued)

FOREIGN PATENT DOCUMENTS

| | | |
|---|---|---|
| DE | 112004000218 T5 | 12/2005 |
| WO | 2004068617 A2 | 8/2004 |

OTHER PUBLICATIONS

L. Theolier et al., "A New Junction Termination Technique: the Deep trench Termination (DT2)", ISPSD, 2007, pp. 176-179.

(Continued)

*Primary Examiner* — Chandra Chaudhari
(74) *Attorney, Agent, or Firm* — Abel Law Group, LLP

(57) ABSTRACT

An electronic device can include an electronic component and a termination region adjacent to the electronic component region. In an embodiment, the termination region can include an insulating region that extends a depth into a semiconductor layer, wherein the depth is less than 50% of the thickness of the semiconductor layer. In another embodiment, the termination region can include a first insulating region that extends a first depth into the semiconductor layer, and a second insulating region that extends a second depth into the semiconductor layer, wherein the second depth is less than the first depth. In another aspect, a process of forming an electronic device can include patterning a semiconductor layer to define a trench within termination region while another trench is being formed for an electronic component within an electronic component region.

20 Claims, 9 Drawing Sheets

(56) References Cited

U.S. PATENT DOCUMENTS

| | | |
|---|---|---|
| 6,639,260 B2 | 10/2003 | Suzuki et al. |
| 6,674,126 B2 | 1/2004 | Iwamoto et al. |
| 6,677,626 B1 | 1/2004 | Shindou et al. |
| 6,825,510 B2 | 11/2004 | Probst |
| 6,921,699 B2 | 7/2005 | Ma et al. |
| 6,927,451 B1 | 8/2005 | Darwish |
| 6,982,193 B2 | 1/2006 | Hossain et al. |
| 7,176,524 B2 | 2/2007 | Loechelt et al. |
| 7,253,477 B2 | 8/2007 | Loechelt et al. |
| 7,285,228 B2 | 10/2007 | Laermer et al. |
| 7,285,823 B2 | 10/2007 | Loechelt et al. |
| 7,411,266 B2 | 8/2008 | Tu et al. |
| 7,489,011 B2 | 2/2009 | Yilmaz |
| 7,655,981 B2 | 2/2010 | Lee et al. |
| 7,727,831 B2 | 6/2010 | Ohtani |
| 7,759,204 B2 | 7/2010 | Hshieh et al. |
| 7,786,533 B2 | 8/2010 | Disney |
| 8,174,067 B2 | 5/2012 | Yedinak et al. |
| 8,222,693 B2 | 7/2012 | Koops et al. |
| 8,247,296 B2 | 8/2012 | Grivna |
| 8,269,272 B2 | 9/2012 | Tomita et al. |
| 8,304,829 B2 | 11/2012 | Yedinak et al. |
| 8,415,739 B2 | 4/2013 | Venkatraman et al. |
| 2010/0317158 A1 | 12/2010 | Yilmaz et al. |
| 2011/0309464 A1 | 12/2011 | Yamamoto et al. |
| 2012/0187526 A1 | 7/2012 | Roig-Guitart et al. |
| 2012/0187527 A1 | 7/2012 | Guitart et al. |

OTHER PUBLICATIONS

U.S. Appl. No. 14/025,587, filed Sep. 12, 2013, Inventors: Jaume Roig-Guitart et al.

Wolf, Stanley, "Silicon Processing for the VLSI Era," vol. 2: Process Technology, Lattice Press, 1990, 5 pgs.

C. Basavana et al., "Breakdown Voltage of Field Plate and Field-Limiting Ring Techniques: Numeral Comparison," IEEE, TED vol. 39, No. 7, 1992, pp. 1768-1770.

D.S. Byeon et al., "Optimum Design of the Cylindrical P+N Junction with Field Plate," ISPS, 1996, pp. 41-48.

J. Korec et al., "Comparision of DMOS/IGBT—Compatible High-Voltage Termination Structures and Passivation Techniques," IEEE, 1993, pp . 1845-1854.

U.S. Appl. No. 14/249,882, filed Apr. 10, 2014, "Process of Forming an Electronic Device Having a Termination Region Including an Insulating Region", Inventors: Jaume Roig-Guitart et al.

Wolf, Stanley, "Silicon Processing for the VLSI ERA," vol. 2: Process Integration, Isolation Technologies for Integrated Circuits, Lattice Press, 1990, pp. 39-41.

* cited by examiner

ELECTRONIC DEVICE HAVING A TERMINATION REGION INCLUDING AN INSULATING REGION

FIELD OF THE DISCLOSURE

The present disclosure relates to electronic devices and processes of forming electronic devices, and more particularly to, electronic devices having termination regions including insulating regions and processes of forming the same.

RELATED ART

An electronic device designed for high voltage applications includes an electronic component region and a termination region. The electronic component region can include transistors, resistors, capacitors, diodes, or the like. The termination region is used to dissipate high voltage so that portions of the electronic component region are not at such high voltages. A molding compound can be formed over the termination region during a packaging operation. Mobile ions may migrate from the molding compound into an epitaxial silicon layer within the termination region. The mobile ions can adversely affect the drain-to-source breakdown voltage ($BV_{DSS}$) for a transistor within the electronic component region.

A field plate may be placed over a portion of the epitaxial silicon layer to protect such layer from mobile ions. The field plate is separated from the epitaxial silicon layer by a thick oxide layer can be deposited over the epitaxial silicon layer. In another attempt to solve the problem, a trench can be formed through all or at least more than 50% of the thickness of the epitaxial silicon layer, and then the trench is filled with oxide. For electronic devices that are designed to operate at a voltage of at least 500 V, such an alternative introduces substantial process complexity, which can adversely affect yield.

BRIEF DESCRIPTION OF THE DRAWINGS

Embodiments are illustrated by way of example and are not limited in the accompanying figures.

Figure 1:
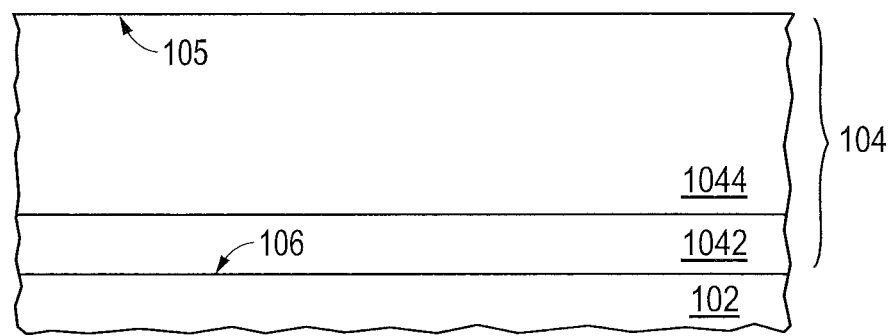
FIG. 1 includes an illustration of a cross-sectional view of a portion of a workpiece that includes a buried conductive region and a semiconductor layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 500 V difference maintained between the source and drain of the transistor when the transistor is in an off-state. For example, when the transistor is in an off-state, a 500 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include an electronic component and a termination region adjacent to the electronic component region. In an embodiment, the termination region can include a substrate, a semiconductor layer having a thickness, a primary surface and an opposite surface. The semiconductor layer can overlie the substrate, wherein the substrate is closer to the opposite surface than the primary surface. The termination region can further include an insulating region that extends a depth into the semiconductor layer, wherein the depth is less than 50% of the thickness of the semiconductor layer. The termination region can still further include a field electrode overlying the semiconductor layer and the insulating region.

In another embodiment, the termination region can include a substrate and a semiconductor layer having a thickness, a primary surface and an opposite surface, wherein the semiconductor layer overlies the substrate, and the substrate is closer to the opposite surface than the primary surface. The termination can further include a first insulating region that extends a first depth into the semiconductor layer, a second insulating region that extends a second depth into the semiconductor layer, wherein the second depth is less than the first depth. The termination region can still further include a field electrode overlying the semiconductor layer, the first insulating region, and the second insulating region.

As described below in more detail, the termination region has a structure that allow the area occupied by the termination region to be reduced by 50% as compared to termination regions as used in conventional electronic devices. Alternatively, the structure allows a larger voltage to be used when area is kept the same as in the conventional electronic devices. Furthermore, the insulating region can be formed within a trench to help keep the electronic device more planar, as compared to using a thick insulating layer over a primary surface of a semiconductor layer.

In another aspect, a process of forming an electronic device can include providing a substrate and a semiconductor layer overlying the substrate, wherein the semiconductor layer has a primary surface and an opposite surface, wherein the substrate is closer to the opposite surface than the primary surface. The process can further include removing portions of the semiconductor layer to form simultaneously a first trench and a second trench, wherein the first trench lies within a termination region of the electronic device, and the second trench lies within an electronic component region of the electronic device. The process can further include forming a gate dielectric layer within the first trench and the second trench, forming a gate electrode layer over the gate dielectric layer, removing portions of the gate electrode layer from the first trench and over the semiconductor layer outside of the first and second trenches, wherein a gate electrode is formed within the second trench. The process can still further include forming a first insulating layer to fill a remaining portion of the first trench to form a first insulating region within the termination region, and forming a field electrode over the first insulating region. The process of forming the termination region is well suited for integration with the formation of a transistor structure within the electronic component region. The electronic device and process of forming the device are better understood in conjunction with the exemplary non-limiting embodiments described herein.

FIG. 1 includes an illustration of a cross-sectional view of a portion of a workpiece that includes a buried conductive region 102 and a semiconductor layer 104. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least $1\times10^{19}$ atoms/cm$^3$, and lightly doped is intended to mean a peak dopant concentration of less than $1\times10^{19}$ atoms/cm$^3$. The buried conductive region 102 can be a portion of a heavily doped substrate (e.g., a heavily n-type doped wafer) or may be a buried doped layer disposed over a substrate of opposite conductivity type or over a buried insulating layer (not illustrated) that is disposed between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer. The buried conductive region 102 will be used to electrically connect a drain of a transistor structure to a drain terminal of the electronic device.

The semiconductor layer 104 is disposed over the buried conductive region 102 and has a primary surface 105, where the transistors and other electronic components (not illustrated) are formed, and an opposite surface 106, wherein the substrate is closer to the opposite surface 106 than to the primary surface 105. The semiconductor layer 104 can include a buffer layer 1042 and a lightly doped layer 1044. Each of the buffer and lightly doped layers 1042 and 1044 can include a Group 14 element and any of the dopants as described with respect to the buried conductive region 102. In an embodiment, the buried conductive region 102 is heavily n-type doped, and the buffer layer 1042 can have a dopant concentration that is between the dopant concentrations of the buried conductive region 102 and the lightly doped layer 1044. In a particular embodiment, each of the layers 1042 and 1044 can be formed by epitaxially growing silicon layers having the appropriate dopant concentrations.

The thickness of the semiconductor layer 104 can depend on drain-to-source breakdown voltage $BV_{DSS}$ of a transistor structure that is at least partly formed within the semiconductor layer 104. In an embodiment, the transistor structure has a $BV_{DSS}$ of at least 500 V, and the thickness of the semiconductor layer 104 is at least 35 microns, and in another embodiment, the transistor structure has a $BV_{DSS}$ of at least 700 V, and the thickness of the semiconductor layer 104 is at least 45 microns. In a particular embodiment, the thickness of the semiconductor layer 104 is in a range of 30 microns to 100 microns. Within the semiconductor layer 104, the buffer layer 1042 can have a thickness in a range of 12 microns to 18 microns, and the lightly doped layer 1044 can make up the remainder of the thickness of the semiconductor layer 104.

In an embodiment, the buffer layer 1042 has a doping concentration in a range of $10^{15}$ atoms/cm$^3$ to $10^{16}$ atoms/cm$^3$, and the lightly doped layer 1044 has a dopant concentration of at least $10^{14}$ atoms/cm$^3$. The semiconductor layer 104 may be disposed over all of the workpiece. The dopant concentration within the lightly doped layer 1044 as formed or before selectively doping regions within the lightly doped layer 1044 will be referred to as the background dopant concentration. In the embodiment as illustrated FIG. 1, a termination region 120 is in the left-hand and center portions of the illustration, and the electronic component region 140 is in the right hand portion of the illustration.

In another embodiment, the semiconductor layer 104 can be formed with a gradually changing dopant concentration within buffer layer 1042, such that the dopant concentration of the buffer layer 1042 at a location adjacent to the buried conductive region 102 is closer to the buried conductive region 102 as compared to the lightly doped layer 1044, and the dopant concentration of the buffer layer 1042 at a location adjacent to the lightly doped layer 1044 is closer to the lightly doped regions 1044 as compared to the buried conductive region 102. In still another embodiment, the semiconductor layer 104 may be replaced by a single semiconductor layer have a substantially uniform concentration throughout its thickness, although some dopant from the buried conductive region 102 may diffuse into the semiconductor layer 104 during formation of the semiconductor layer 104. In subsequent figures, the semiconductor layer 104 may have any of the previously described and will be illustrated as the semiconductor layer 104 to simplify understanding of the concepts described herein, regardless whether the semiconductor layer 104 is a single layer, includes a plurality of layers, and whether the single layer or each layer within the plurality of layers has a substantially uniform doping concentration or a graded dopant concentration.

Figure 2:
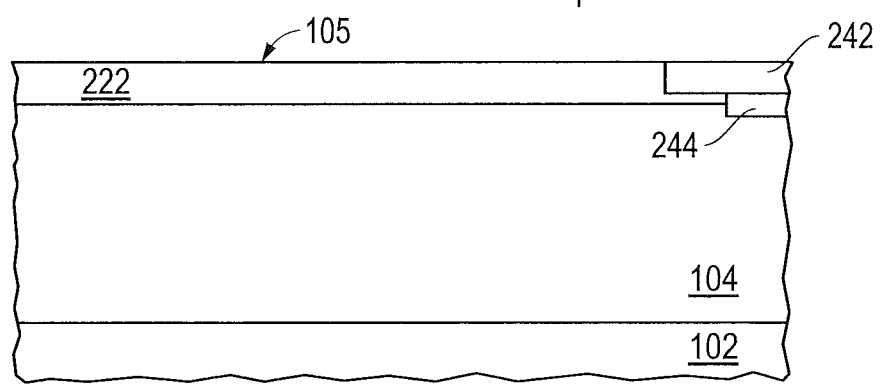
FIG. 2 includes an illustration of a cross-sectional view of the workpiece of FIG. 1 after forming a termination doped region, a body region, and a link region.

FIG. 2 illustrates the workpiece after forming a termination doped region 222, a body region 242, and a link region 244. The termination doped region 222, the body region 242, and the link region 244 can be formed in any order or in a particular order if needed or desired for a particular application.

The termination doped region 222 can help to distribute more evenly the electrical field along the primary surface 105, particularly within the termination region 120 adjacent to the electronic component region 140. The termination doped region 222 can be formed by blanket implant, over all of the termination region 120 or at a location from a subsequently-formed insulating region extending laterally into part of the electronic component region 140. Referring to FIG. 2, the portion of the termination doped region 222 toward the left-hand side is optional. The depth of the termination doped region 222 can be shallower than the subsequently-formed isolation region. In an embodiment, the termination doped region 222 is in a range of 50% to 99% of the depth of the subsequently-formed isolation region. The termination doped region 222 has an opposite conductivity type as compared to the semiconductor layer 104. In an embodiment, the peak doping concentration of the termination doped region 222 is 0.5 to 1.5 orders of magnitude higher than the semiconductor layer 104. For example, when the semiconductor layer 104 has a dopant concentration of $1\times10^{14}$ atoms/cm$^3$, the termination doped region 222 can have a peak dopant concentration of $1\times10^{15}$ atoms/cm$^3$. The termination doped region 222 can be formed by ion implantation with a dose in a range of $5\times10^{10}$ ions/cm$^2$ to $1\times10^{12}$ ions/cm$^2$. The energy for the ion implantation can be selected to achieve a projected range consistent with the depths as previously described.

The body region 242 may include channel regions for transistor structures that are being formed within the electronic component region 140. The body region 242 has an opposite conductivity type as compared to the semiconductor layer 104 and can have a peak dopant concentration of in range of $1\times10^{16}$ atoms/cm$^3$ to $1\times10^{18}$ atoms/cm$^3$. The body region can be formed by ion implantation with a dose in a range of $5\times10^{12}$ ions/cm$^2$ to $5\times10^{13}$ ions/cm$^2$. The energy can be selected to achieve a projected range of 0.2 micron to 0.9 micron.

The link region 244 helps to lower the resistivity of the current flow path between the channel and the pillar regions. The link region 244 is formed at a depth further from the primary surface 105 than the body region 242. The link region 244 has a conductivity type opposite that of the body region 242 and can have a peak dopant concentration in a range of $5\times10^{16}$ atoms/cm$^3$ to $5\times10^{18}$ atoms/cm$^3$. The link region 244 can be formed by ion implantation with a dose in a range of $1\times10^{13}$ ions/cm$^2$ to $1\times10^{14}$ ions/cm$^2$. The energy can be selected to achieve a projected range of 0.5 micron to 1.5 microns.

Figure 3:
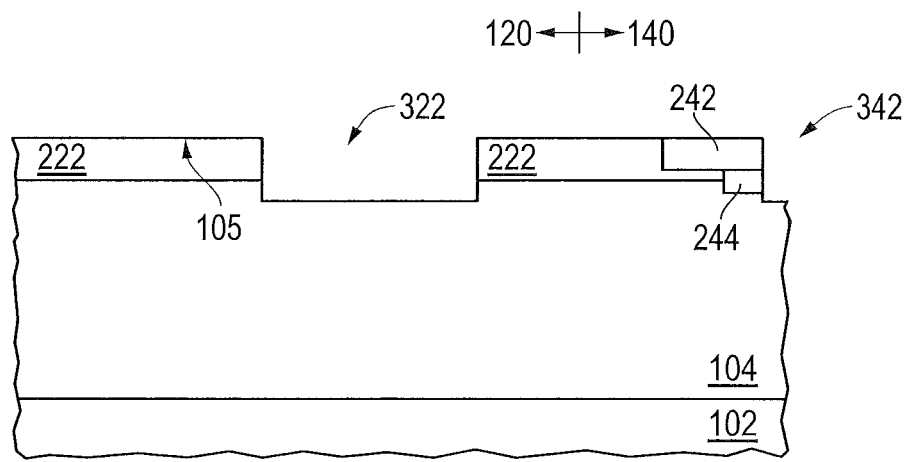
FIG. 3 includes an illustration of a cross-sectional view of the workpiece of FIG. 2 after patterning the semiconductor layer to form trenches.

FIG. 3 includes an illustration of the workpiece after patterning the workpiece to define trenches 322 and 342, where the trench 342 is used in forming a gate electrode for a transistor structure within the electronic component region 140. The trench 322 extends completely through the termination doped region 222 and into the semiconductor layer 104, and the trench 342 extends through the body region 242 and at least into the link region 244. In the embodiment as illustrated, the trench 342 extends through the link region 244 and into the semiconductor layer 104. The trenches 322 and 342 can be formed simultaneously and have substantially the same depth, as formation of an insulating region within the trench 342 is integrated with formation of components and layers within the electronic component region 140. In an embodiment, the depths of the trenches 322 and 342 is less than 50% of the thickness of the semiconductor layer 104, and in a more particular embodiment is in a range of 2% to 20% of the thickness of the semiconductor layer 104. The depths can also be expressed as a measure of distance. In an embodiment, the depths of the trenches 322 and 342 is in a range of 0.5 micron to 9 microns from the primary surface 105, and in a more particular embodiment, is in a range of 1 to 5 microns. The width of the trench 322 is addressed later in this specification. In a further embodiment, the trenches 322 and 342 can be formed at different times and to different depths if needed or desired.

Figure 4:
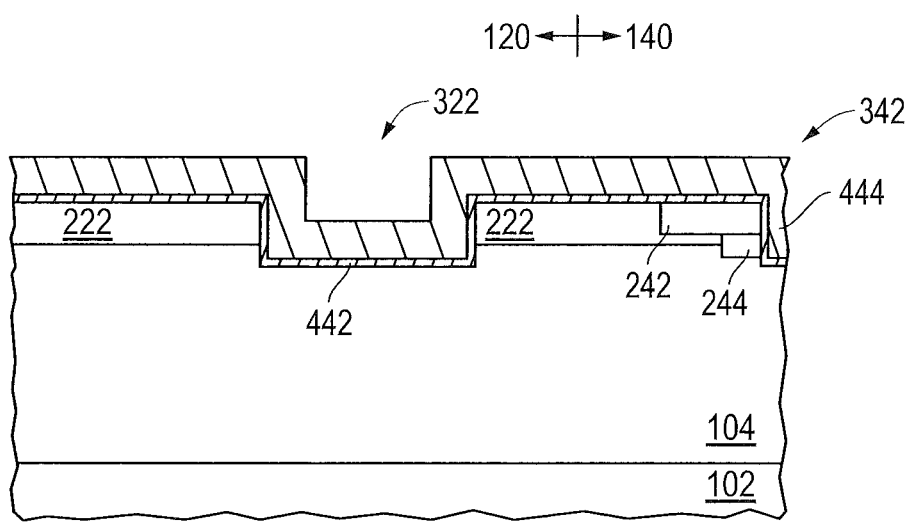
FIG. 4 includes an illustration of a cross-sectional view of the workpiece of FIG. 3 after forming insulating layer and conducting layer.

FIG. 4 includes an illustration of the workpiece after forming a gate dielectric layer 442 and a gate electrode layer 444. The gate dielectric layer 442 includes an oxide, a nitride, an oxynitride, or any combination thereof and has a thickness in a range of 5 nm to 100 nm. The gate dielectric layer 442 can be formed by thermal oxidation, deposition, or a combination thereof. The gate electrode layer 444 can be formed by depositing a layer of material that is conductive as deposited or can be subsequently made conductive. The gate electrode layer 444 can include a metal-containing or semiconductor-containing material. The gate electrode layer 444 may be deposited to a thickness sufficient to fill completely the trench 342. In the embodiment illustrated, the trench 322 is only partly filled because the trench 322 is substantially wider than 0.5 times the thickness of the gate electrode layer 444. In an embodiment, the gate electrode layer 444 is deposited to a thickness in a range of 0.2 micron to 1.0 micron.

Figure 5:
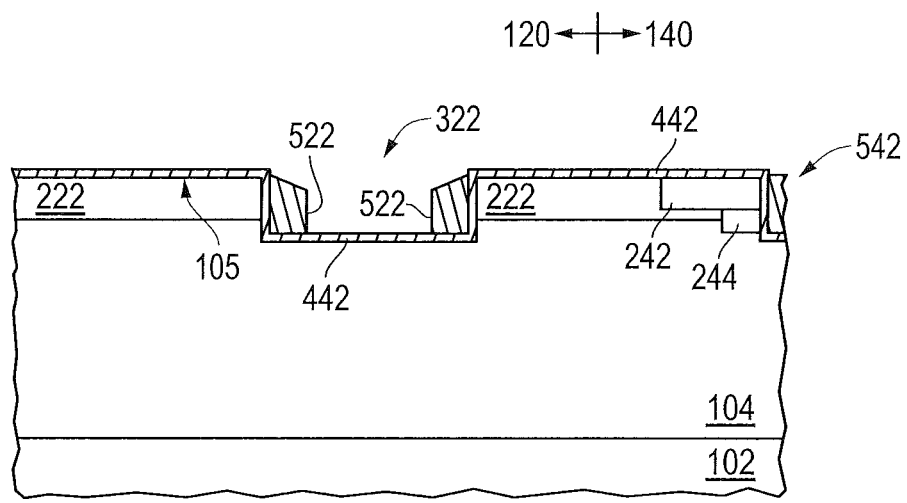
FIG. 5 includes an illustration of a cross-sectional view of the workpiece of FIG. 4 after forming a gate dielectric layer and a gate electrode.

Referring to FIG. 5, parts of the gate electrode layer 444 are removed to form a gate electrode 542 within the trench 342. In an embodiment, the gate electrode layer 444 is etched to form the gate electrode 542. In the illustrated embodiment, the gate electrode 542 is formed without using a mask. The etch may be performed with an isotropic etchant or an anisotropic etchant. After the etch, the gate electrode 542 substantially completely fills the trench 342. If needed or desired, the gate electrode 542 may be recessed within the trench 342 to reduce capacitance between the gate electrode 542 and a subsequently-formed source region for the transistor structure. When an anisotropic etchant is used, a residual portion 522 of the gate electrode layer 444 is formed within an inner perimeter of the trench 322. When an isotropic etchant is used, the residual portion 522 may not be formed or may be significantly smaller than illustrated in FIG. 5. A masking layer can be formed over the electronic component region 140, and the residual portions 522 of the gate electrode layer 444 are removed from the trench 322. The masking layer is subsequently removed. In another embodiment, the residual portion 522 may remain and are not removed. A subsequently-formed insulating layer will be formed and encapsulate the residual portion 522, wherein the residual portion 522 electrically floats. If needed or desired, portions of the gate dielectric layer 442 within the trench 322 and overlying the primary surface 105 may be removed.

Figure 6:
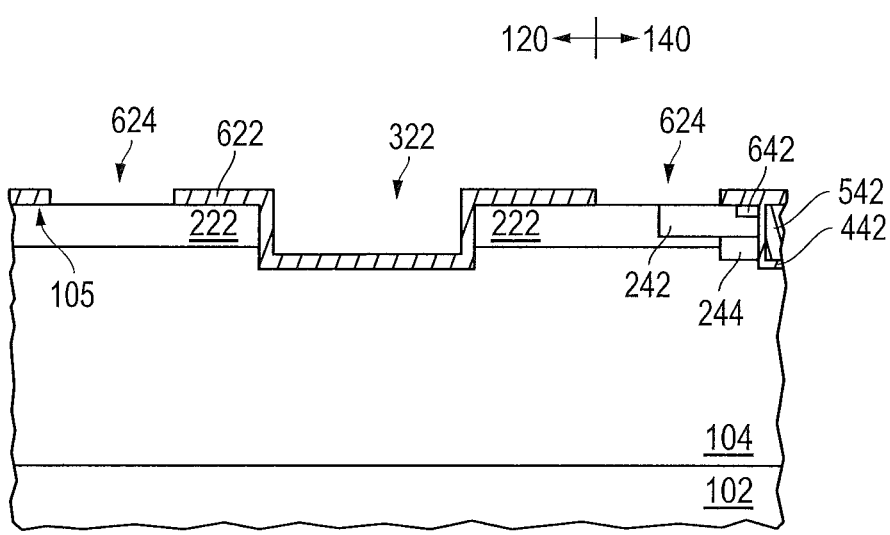
FIG. 6 includes an illustration of a cross-sectional view of the workpiece of FIG. 5 after forming removing residual portions of a gate electrode layer from a trench and patterning an insulating layer to define openings through the insulating layer.

In FIG. 6, a source region 642 can be formed before or after portions of the gate dielectric layer 442 are removed. The source region 642 has a conductivity type opposite the body region 242 and a dopant concentration of at least $1 \times 10^{19}$ atoms/cm$^3$. The depth of the source region is in a range of 0.05 micron to 0.3 micron.

A dielectric layer 622 can be formed over all of the workpiece. The dielectric layer 622 is used in etching deep trenches into the semiconductor layer 104, and therefore, the dielectric layer 622 has a composition and thickness sufficient to withstand etching the trenches without being completely eroded during the etch. In an embodiment, the dielectric layer 622 includes a silicon oxide, such as low pressure chemical vapor deposition using tetraethyloxyorthosilicate ("LPCVD TEOS"); a silicon nitride; a silicon oxynitride; or the like, and is deposited to a thickness in a range of 0.5 micron to 1.5 microns or greater. A masking layer is patterned to define corresponding openings under which vertical regions will be formed. The patterning can be performed using an anisotropic etchant. The etch may be performed as a timed etch, an endpoint etch or as an endpoint etch with a timed overetch. Portions of the termination doped region 222 and body region 242 may be removed during an overetch portion when defining the openings 624. The masking layer can be retained for subsequent processing or removed to leave portions of the dielectric layer 622, termination doped region 222, and body region 242 exposed. Part of the trench 322 is filled with the dielectric layer 622.

Figure 7:
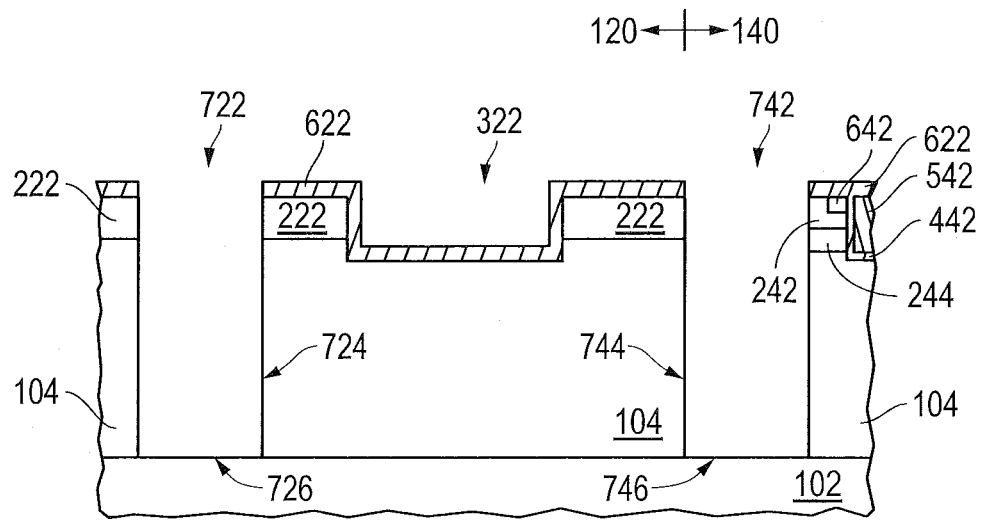
FIG. 7 includes an illustration of a cross-sectional view of the workpiece of FIG. 6 after patterning the semiconductor layer to define trenches extending from the primary surface towards the buried conductive region.

FIG. 7 includes an illustration after removing the masking layer, portions of the termination doped region 222, the body region 242, and the semiconductor layer 104 to define deep trenches 722 and 742. The trenches 722 and 742 can have depths that extend from the primary surface 105 towards the buried conductive region 102. In an embodiment, the trenches 722 and 742 extend to the buried conductive region 102. Thus, the depths of the trenches may have any values as described with respect to semiconductor layer 104 as originally formed. In an embodiment, a portion of the buried conductive region 102 may also be etched, for example, during an overetch portion of the etch sequence. In a further embodiment, the trenches 722 and 742 may extend partly and not completely through the semiconductor layer 104. In a particular embodiment, the trenches 722 and 742 may extend though the lightly doped layer 1044 and into the buffer layer 1042, as illustrated in FIG. 1.

The trenches 722 and 742 can be formed by anisotropically etching the portions of the termination doped region 222, the body region 242, and the semiconductor layer 104 underlying openings in the hard mask layer 622. Sidewalls 724 and 744 are substantially vertical, and the bottom surfaces 726 and 746 of the trenches 722 and 742 are generally flat; however the corners between the sidewalls 724 and 744 and bottom surfaces 726 and 746 of the trenches 722 and 742 may be rounded.

The etching can be performed with a chemistry that is highly selective to the material within the dielectric layer 622. While some of the dielectric layer 622 may be eroded during the etch, the dielectric layer 622 is not eroded such that the dielectric layer 622 becomes too thin and unable to protect underlying portions of the workpiece. When the semiconductor layer 104 includes silicon, the etch can be performed by any one of deep silicon etch tools using an etch process, such as a process as described in U.S. Pat. No. 7,285,228, which is incorporated herein by reference in its entirety. The process disclosed in the patent is a well-known process for high aspect ratio deep silicon etching that cycles between isotropic surface passivation of the sidewalls 724 and 744 and reactive ion etch passivation clearing at the trench bottom. In an embodiment, the selectivity of silicon to an organic resist material can be in a range of approximately 80:1 to 100:1. If a mask uses an oxide or metal that is not significantly etched by fluorine, such as a $Al_2O_3$ or AlN mask, the selectivity can be substantially higher. Etching can be performed as a timed etch, an endpoint etch, or an endpoint etch with a timed overetch.

Figure 8:
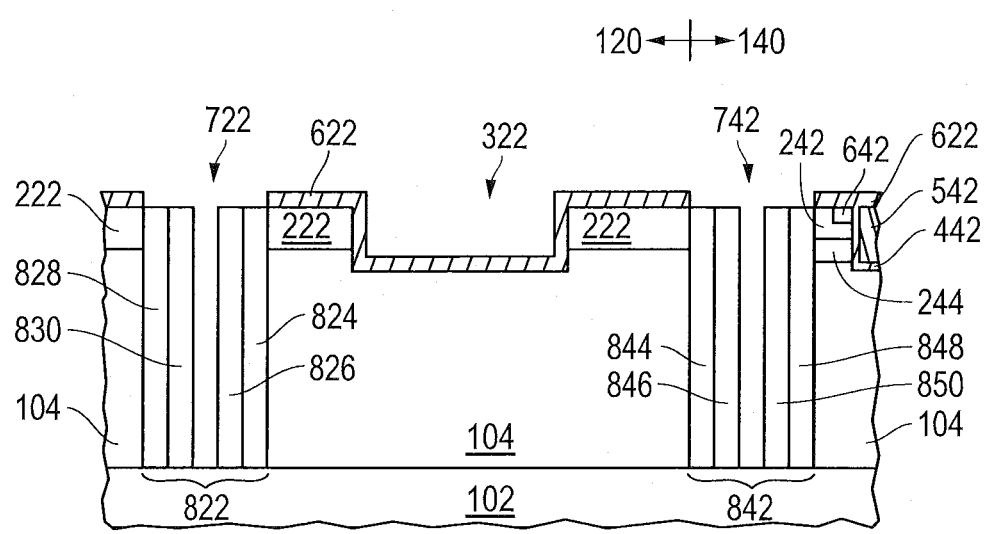
FIG. 8 includes an illustration of a cross-sectional view of the workpiece of FIG. 7 after forming doped regions within the trenches.

Referring to FIG. 8, an edge vertical region 822 and an active vertical region 842 can be formed within the trenches 722 and 742. The vertical regions 822 and 842 may have a NP-buffer-PN, PN-buffer-NP, or NP-buffer-N vertical structure. The vertical regions 822 and 842 can have any of structures of the termination regions as disclosed in US 2012/0187526, which is incorporated herein by reference in its entirety. The function of the vertical regions 822 and 842 during operation are described later in this specification.

In the particular embodiment as illustrated in FIG. 8, the vertical regions 822 and 842 include doped regions 824, 828, 844, and 848 adjacent to and having the same conductivity type as the semiconductor layer 104. The vertical regions also include doped regions 826, 830, 846, and 850 adjacent to and having the opposite conductivity type as compared to the semiconductor layer 104. The dopant concentrations of the doped regions 824, 826, 828, 830, 844, 846, 848, and 850 can be in a range of $1 \times 10^{16}$ atoms/cm$^3$ to $1 \times 10^{17}$ atoms/cm$^3$. In a particular embodiment, the doped regions 824, 826, 828, and 830 have substantially the same dopant concentration, and the doped regions 826, 830, 846, and 850 have substantially the same dopant concentration. The dopant concentration of each of the doped regions 824, 828, 844, and 848 can have a dopant concentration that is within 10% of the dopant concentration of each of the doped regions 826, 830, 846, 850.

Within the active vertical region 842, the doped region 848 provides a low resistance current path for the electronic component region 140. In an exemplary embodiment, the doped region 848 can be an N-type doped semiconductor layer with a concentration of approximately $6 \times 10^{16}$ atoms/cm$^3$. The doped region 850 can be a P-type doped semiconductor layer and provides a PN junction between doped region 848 and the doped region 850, and provides charge compensation for the doped region 848 under full depletion conditions. In at least one exemplary embodiment the doped region 850 can be P-type doped with a concentration approximately $6 \times 10^{16}$ atoms/cm$^3$.

In an embodiment, the doped regions 824, 826, 828, 830, 844, 846, 848, and 850 are formed by epitaxially growing the doped regions as semiconductor layers. In a particular embodiment, the doped regions 824, 828, 844, 848 can be formed by selective epitaxially growing the doped regions as N-type doped semiconductor layers from exposed portions of the semiconductor layer 104 within the trenches 722 and 742. Portions of the N-type doped semiconductor layers can form along the bottom surfaces 726 and 746 of the trenches 722 and 742. The portions of the N-type doped semiconductor layers between the vertical regions can be removed by an anisotropic etch to provide the doped regions 824, 828, 844, and 848 in the form of vertical sidewall regions within the trenches 722 and 742 as illustrated in FIG. 8. The same process may be repeated for the doped regions 826, 830, 846, and 850 when forming such regions from P-type semiconductor layers.

Figure 9:
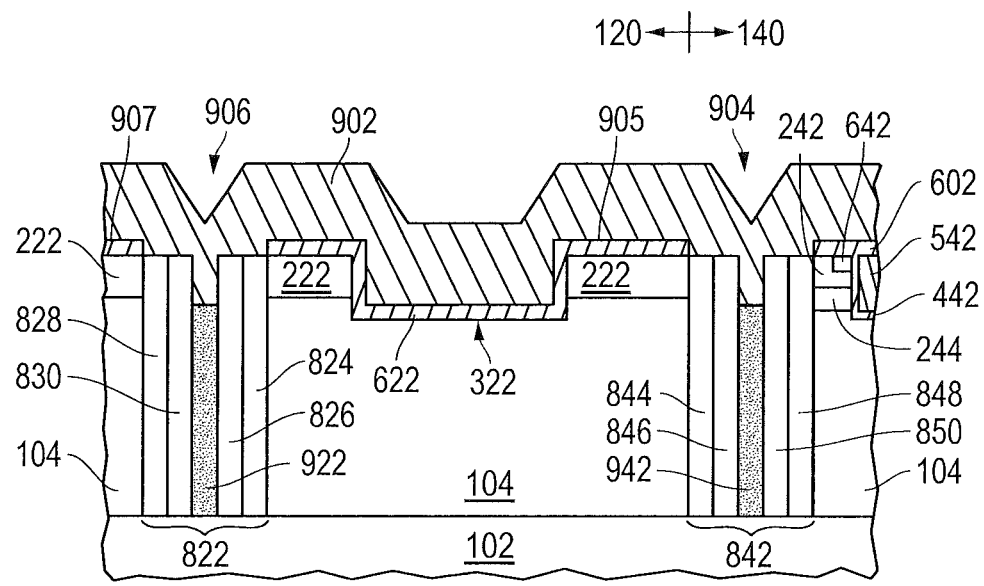
FIG. 9 includes an illustration of a cross-sectional view of the workpiece of FIG. 8 after forming an insulating layer, such that the insolation pillars include buffer regions that include voids.

A buffer region (for example, an insulating layer, an intrinsic semiconductor layer, a void, or any combination thereof) can be positioned between the doped regions 826 and 830 and between the doped regions 846 and 850. In an embodiment as illustrated in FIG. 9, the buffer regions includes voids 922 and 942 and portions of an insulating layer 902 within the trenches 722 and 742. The insulating layer 902 can be formed using a chemical vapor deposition (CVD)/bias-sputter etchback technique, such as described at pages 220-22 of *Silicon Processing for the VLSI Era*, Vol. 2—Process Integration by Wolf, Lattice Press (1990) ("Wolf"). Unlike the description in Wolf, which does not want to form voids, the insulating layer 902 seals off the top of the opening between the vertical doped regions 826 and 830 to form the void 922 and the top of the opening between the vertical doped regions 846 and 850 to form the void 942. Along the uppermost surface of the insulating layer 902, the lowest points 904 and 906 above the voids 922 and 942 lie at elevations higher than points 905 and 907 along the upper surface of the dielectric layer 622 adjacent to the vertical regions 822 and 842.

As deposited, the insulating layer 902 has a thickness sufficient to fill the remainder of the trench 322. The insulating layer 902 can include an oxide, a nitride, an oxynitride, an organic dielectric, or any combination thereof. The insulating layer 902 can include a single film or a plurality of discrete films. The insulating layer 902 can be deposited to a thickness in a range of 0.5 micron to 5.0 microns. The insulating layer 902 can be planarized after deposition.

In another embodiment, a CVD/bias-sputter etchback process is not used. The insulating layer 902 can be deposited non-conformally and seal off portions of the trenches 722 and 742 between the doped regions 826 and 846, which results in the formation of the voids 922 and 942. An etch-stop film, an antireflective film, or a combination may be used within or over the insulating layer 902 to help with processing.

Figure 10:
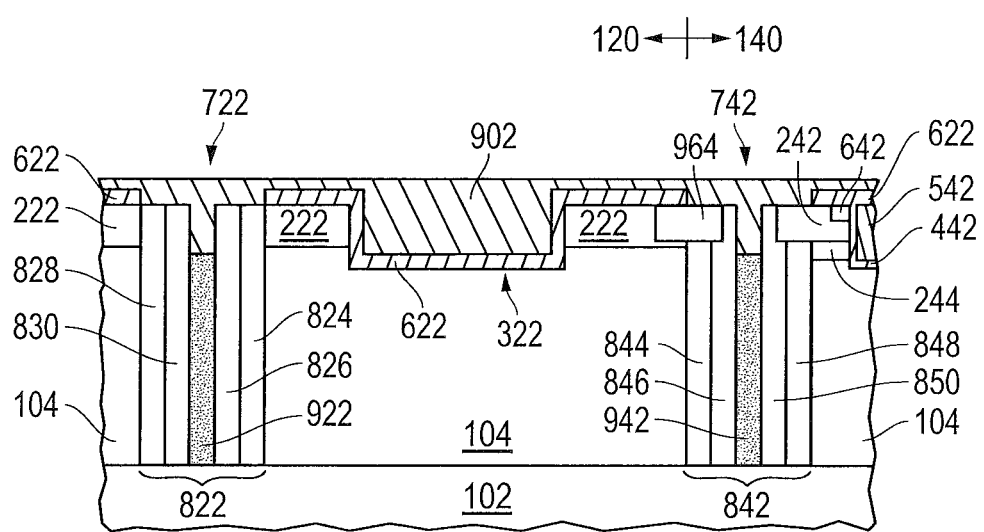
FIG. 10 includes an illustration of a cross-sectional view of the workpiece of FIG. 9 after planarizing the insulating layer.

An extended body region 962 and an extended termination doped region 964 can also be formed, as illustrated in FIG. 10. In an embodiment, one or more doping actions can be performed to extend the body region 242 (not separately labelled in FIG. 10) to the vertical doped region 850 and the termination doped region 222 to the vertical doped region 846. Such doping is performed using a dopant having the same conductivity type as the termination doped region 222 and body region 242. Thus, the vertical doped regions 846 and 850 do not electrically float in this embodiment. In a particular embodiment, such doping is not performed for the edge vertical region 822 within the termination region 120. Thus, the vertical doped regions 826 and 830 may be allowed to electrically float.

In another embodiment, the extended body and termination doped regions can be formed by diffusing dopant from the termination doped and body regions 222 and 242 to the vertical doped regions 846 and 850, respectively. In such an embodiment, the dopant concentrations of the termination and body regions 222 and 242 are higher than the dopant concentrations of the doped regions 846 and 850. In this embodiment, within the termination region 120, the termination doped region 222 may extend to the vertical doped regions 826 and 830. The vertical doped regions 826 and 830 may electrically float when the termination doped region 222 to the left of the trench 322 is not electrically connected to another part of the electronic device. If the termination doped region 222 to the left of the trench 322 is electrically connected to another portion of the electronic device, such as ground or a constant voltage terminal, the vertical doped regions 826 and 830 will not electrically float.

Figure 11:
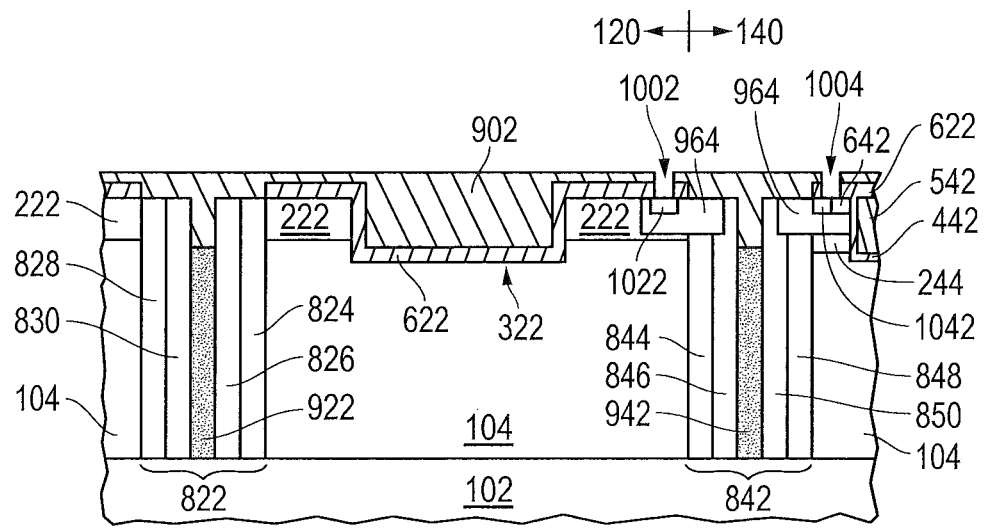
FIG. 11 includes an illustration of a cross-sectional view of the workpiece of FIG. 10 after forming patterning the planarized insulating layer to define openings and doping contact regions.

The insulating layer 902 is patterned to define contact openings 1002 and 1004, as illustrated in FIG. 11. Portions of the extended termination doped regions 964 and extended body region 962 are doped to form a termination contact region 1022 within the extended termination doped region 964 and a body contact region 1042 within the extended body region 962. The termination contact region 1022 has the same conductivity type as the extended termination doped region 964 and a dopant concentration of at least $1 \times 10^{19}$ atoms/cm$^3$, so that an ohmic contact can be made to a subsequently-formed conductive plug. The body contact region 1042 has the same conductivity type as the extended body region 962 and a dopant concentration of at least $1 \times 10^{19}$ atoms/cm$^3$, so that an ohmic contact can be made to a subsequently-formed conductive plug. In a particular embodiment, the dopant concentration of the body contact region 1042 is less than the dopant concentration of the source region 642. In another particular embodiment, the patterning to define the opening 1004 can be performed, so that at least a portion of the source region 642 is exposed along the sidewall of the opening 1004. In a further embodiment, the opening 1004 can be widened after forming the body contact region 1042, so that a portion of the source region 642 is exposed within the opening 1004. In these two embodiments, the dopant concentration used for the body contact region 1042 may be adjusted more independently of the dopant concentration of the source region 642.

Figure 12:
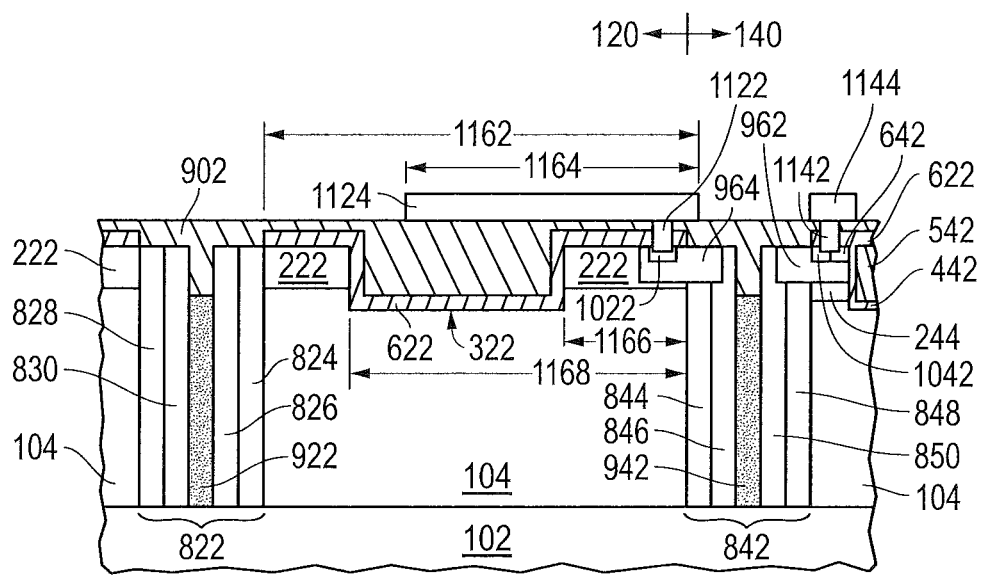
FIG. 12 includes an illustration of a cross-sectional view of the workpiece of FIG. 11 after forming interconnects.

FIG. 12 includes an illustration after forming conductive plugs 1122 and 1142 and a first level of interconnects, including interconnects 1124 and 1144. The conductive plug 1122 is electrically connected to and directly contacts the termination contact region 1022, and the conductive plug 1142 is electrically connected to and directly contacts the source regions 642 and body contact region 1042.

In an embodiment, the conductive plugs 1122 and 1142 can be formed using a plurality of films. In an embodiment, a layer including a refractory metal, such as Ti, Ta, W, Co, Pt, or the like, can be deposited over the workpiece and within the openings 1002 and 1004. The workpiece can be annealed so that portions of the layer including the refractory metal are selectively reacted with exposed silicon, such as substantially monocrystalline or polycrystalline silicon, to form a metal silicide. Thus, portions of the termination contact region 1022, the body contact region 1042, and the source regions 642 can react with the metal within the layer that includes the refractory metal to form a metal silicide. Portions of the layer that include the refractory metal that contact an insulating layer do not react. A metal nitride layer may be formed to further fill a part, but not the remainder of the openings. The metal nitride layer can act as a barrier layer. A layer of a conductive material, such as tungsten, fills the remainder of the contact openings 1002 and 1004. Portions of the layer including the refractory metal, the metal nitride layer and the conductive material that overlies the insulating layer 902 are removed to form the conductive plugs 1122 and 1142.

Interconnects 1124 and 1144 are formed over the conductive plugs 1122 and 1142 and the insulating layer 902. In the embodiment as illustrated in FIG. 12, the interconnect 1124 is a field electrode that helps to shield the semiconductor layer 104 from charge that could migrate from a subsequently-formed molding compound into the semiconductor layer 104. The interconnect 1124 can be electrically connected to a substantially constant voltage terminal, such as a $V_S$ terminal. The interconnect 1144 is electrically connected to the body contact region 1042 and the source region 642. The interconnect 1144 can be electrically connected to the $V_S$ terminal. Although not illustrated, other interconnects can be formed. For example, another interconnect (not illustrated) is formed and is electrically connected to the gate electrode 542 and a gate electrode terminal. The buried conductive region 102 is electrically connected to a $V_D$ terminal and may occur with or without an interconnect. For example, the buried conductive region 102 may be electrically connected to a lead frame of a packaging substrate with a solder or conductive adhesive (for example, silver-filled epoxy).

The interconnects can be formed by depositing a conductive layer that can include a single film or a plurality of films. In an embodiment, adhesion film, a barrier film, or both may be formed. The barrier film can include a nitride, such as TiN, WN, TaN, or the like, and may not adhere well to the insulating layer 902, and the adhesion film can be used to help promote adhesion and may include Ti, Ta, W, a metal-silicon compound or alloy, or any combination thereof. The adhesion film, barrier film, or both can have a thickness in a range of 0.01 micron to 0.1 micron. A bulk film has significantly higher conductivity and can include at least 50 wt % aluminum, tungsten, copper, gold, or the like. The bulk layer can have a thickness in a range of 0.1 micron to 4 microns. An antireflective or capping film can be used to reduce reflection when patterning a subsequently-formed masking layer, to help keep metal from contacting an oxide layer, serve another suitable purpose, or the like. Such antireflective or capping film can include a metal nitride, a silicon nitride, or an oxynitride variant of the foregoing. The thickness of the antireflective or capping film can be in a range of 0.01 micron to 0.05 micron. The conductive layer can be patterned to form the interconnects 1124 and 1144, as illustrated in FIG. 12.

In another embodiment (not illustrated), another insulating layer can be formed over the insulating layer 902 and patterned to form trenches within the other insulating layer that correspond to the shape of the interconnects 1124 and 1144. The conductive layer can be formed over the other insulating layer and within the trenches. Portions of the conductive layer extending outside of the trenches can be removed using chemical-mechanical polishing.

Referring to FIG. 12, some lateral dimensions are discussed to provide a better understanding of positional relationships between features of the electronic device. Many of the values are provided in relative terms because the actual values can depend on the maximum voltage to be sustained between the drain and source of the transistor structure ($BV_{DSS}$). The distance between the electronic component region 140 and the edge vertical region 822 corresponds to the width 1162 of the semiconductor layer 104 in which the trench 322 resides. The width 1162 can be in a range of 0.075 to 0.15 times $BV_{DSS}$, when the width is in units of microns, and $BV_{DSS}$ is in units of volts. Thus, when $BV_{DSS}$ is 600 V, the width 1162 can be in a range of 45 microns to 90 microns.

The interconnect 1124 has a width 1164. As the width 1164 increases, more of the semiconductor layer 104 is shielded; however, if the interconnect 1124 is too close to the edge vertical region 822, breakdown between the interconnect 1124 and the vertical doped region 824 (within the edge vertical region 822) may occur. Such a breakdown would be through at least part of the insulating layers 622 and 902 in the embodiment as illustrated and would cause irreversible damage to the electronic device. Thus, the width 1164 is in a range of 10% to 80% of the width 1162, and in a more particular embodiment is in a range of 30% to 70% of the width 1162.

The trench 322 has sidewalls that are spaced apart from the electronic component region 140 by distances 1166 and 1168. The distance 1166 can be in a range of 2% to 9% of the width 1162, and in a particular embodiment is in a range of 4% to 6% of the width 1162. In an embodiment, the distance 1166 is in a range of 5 microns to 10 microns when $BV_{DSS}$ is 600 V. The distance 1168 can be in a range of 80% to 90% of the width 1162. In an embodiment, the distance 1168 is in a range of 50 microns to 100 microns when $BV_{DSS}$ is 600 V. While particular values in units of microns are given, the distances will increase with a corresponding increase of $BV_{DSS}$; however, the relative comparison between the distances may be valid over a range of $BV_{DSS}$ of several hundred volts.

Figure 13:
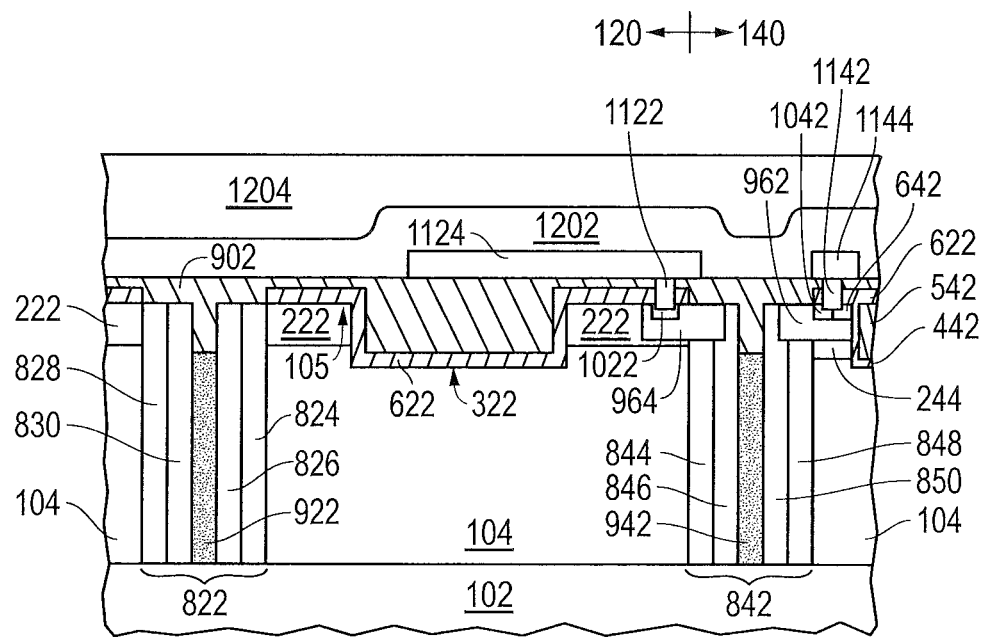
FIG. 13 includes an illustration of a cross-sectional view of the workpiece of FIG. 12 after forming a substantially completed electronic device.

FIG. 13 includes an illustration of a substantially completed electronic device. A passivation layer 1202 is formed over the workpiece. During an assembly operation, the substrate may be in the form of a wafer, and the wafer may be singulated to form dies. Each die can be connected to a packaging substrate, and a molding compound 1204 can be formed over the die, including the termination region 120 and the electronic component region 140.

Although not illustrated, additional or fewer layers or features may be used as needed or desired to form the electronic device. Field isolation regions are not illustrated but may be used to help electrically isolate portions of the power transistor. In another embodiment, more insulating and interconnect levels may be used before forming the passivation layer 1202. After reading this specification, skilled artisans will be able to determine layers and features for their particular application.

The electronic device can include many other transistor structures that are substantially identical to the transistor structure as illustrated in FIG. 13. For example, the transistor structures can be connected in parallel with each other to form the transistor. Such a configuration can give a sufficient effective channel width of the electronic device that can support the relatively high current flow used during normal operation of the electronic device.

As previously described, the vertical regions 822 and 842 can help to facilitate depletion. During operation, the depletion front from the electronic component region 140 reaches the doped region 824 (within the edge vertical region 822) at a particular voltage, such as 200 V. As the voltage is increased, such as from 200 V to 800 V, the depletion advances in the vertical direction while the lateral depletion of the doped region 824 occurs at a slower rate. At a particular voltage, such as 800 V, the doped region 824 becomes depleted at the top (near the primary surface 105), and the depletion reaches a junction between the doped region 824 and the immediately adjacent doped region 826. The complete depletion of the doped region 824 is extended from top to bottom (that is, from the primary surface 105 to the buried conductive region 102). When the doped region 824 is depleted, the doped region 826 can also be depleted.

The buffer region, including the void 922 and a portion of the insulating layer 902, can be positioned between the doped region 826 and the doped region 830 along the opposite side of the void 922. During the process of depletion within the buffer region, the equipotential lines are accumulated into the buffer region. Depending upon the voltage applied, the doped region 826 (within the edge vertical region 822) can be partially depleted or completely depleted at the breakdown voltage. The void 922 and portion of the insulating layer 902 between the doped regions 826 and 830 facilitates laterally confining the equipotential lines in the buffer region. The effect of the potential drop into the buffer region helps to keep the die edge safe from high electric fields. Additionally, the termination region partially sustains the voltage into the buffer region thus avoiding a breakdown voltage degradation.

Alternative embodiments can be used without deviating from the concepts as described herein. In an alternative embodiment, the termination doped region 222 can be partly or completely eliminated. The portion of the termination doped region 222 between active vertical region 842 and the trench 322 helps to provide a high $BV_{DSS}$. In particular, such portion can increase $BV_{DSS}$ by 5% to 10%. Still, the portion can be removed if needed or desired. The other portion of the termination doped region 222, which is between the edge vertical region 822 and the trench 322, does not significantly affect the electrical performance of the electronic device. Such other portion of the termination doped region 222 allows the doping in forming to termination region 120 to be performed as a blanket doping within the termination region 120, and also in the electronic component region 140, so that a masking step can be avoided, and also alignment between the trench 322 and termination doped region 222 is not an issue.

Figure 14:
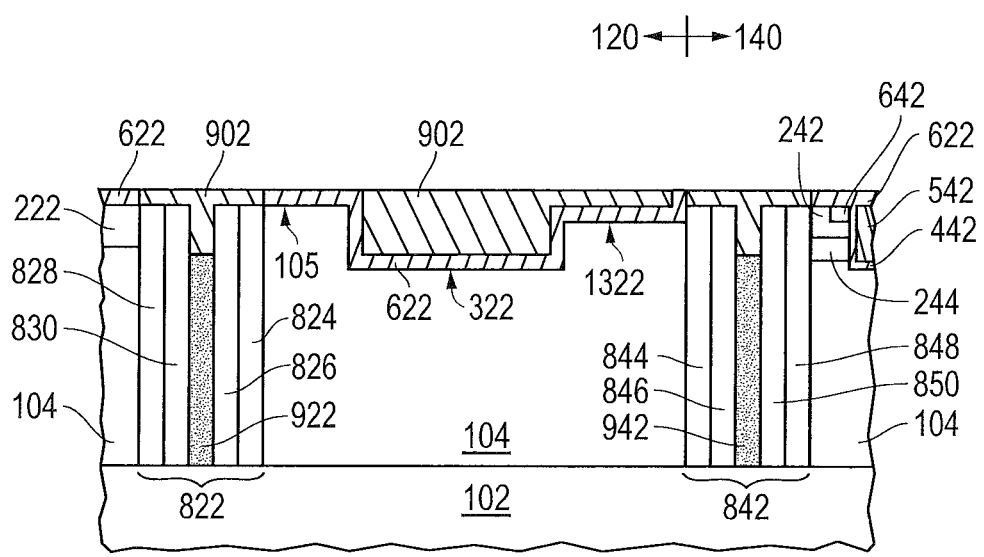
FIG. 14 includes an illustration of a cross-sectional view of a portion of a workpiece that includes insulating regions at different depths into the semiconductor layer within the termination region in accordance with an alternative embodiment.

In another embodiment, a relatively thinner insulating region may be formed between the insulating region corresponding to the trench 322 and the electronic component region 140. Referring to FIG. 14, a portion of the semiconductor layer 104 can be removed to define a trench 1322 that is shallower than the trench 322. The insulating material within the trench 1322 can help to relieve the electric field close to the electronic component region 140 and to make the electrical field distribution between the vertical regions 822 and 842 more uniform. In an embodiment, the depth of the trench 322 is 2 to 5 times greater than the depth of the trench 1322. In a particular embodiment, the depth of the trench 1322 is in a range of 0.5 micron to 1.0 micron deep when $BV_{DSS}$ is at least 500 V. The trench 1322 is formed before the insulating layers 622 and 902 are formed and may be formed before or after forming the trench 322. Although the termination doped region 222 is not illustrated in FIG. 14, the termination doped region 222 may or may not be used in this embodiment. In a particular embodiment, the termination doped region 222 can be formed before forming the trenches 322 and 1322.

Figure 15:
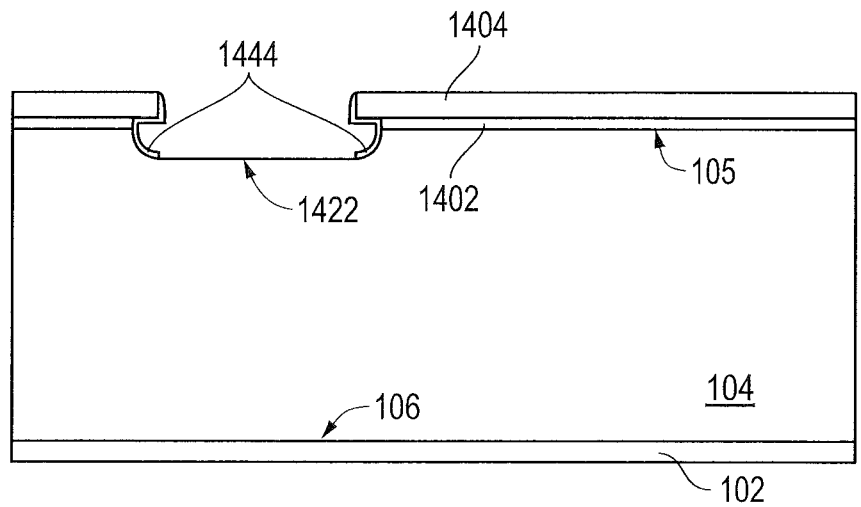
FIG. 15 includes an illustration of a cross-sectional view of a portion of a workpiece that after forming a structure using a sidewall masked isolation technique in accordance with an alternative embodiment.
Figure 16:
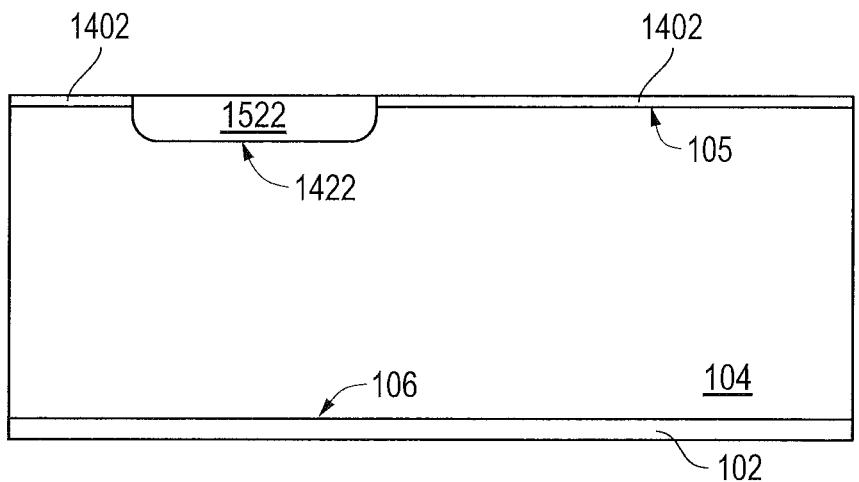
FIG. 16 includes an illustration of a cross-sectional view of the workpiece of FIG. 15 after oxidizing exposed portions of the semiconductor layer and removing pad and oxidation-resistant layers.
Figure 17:
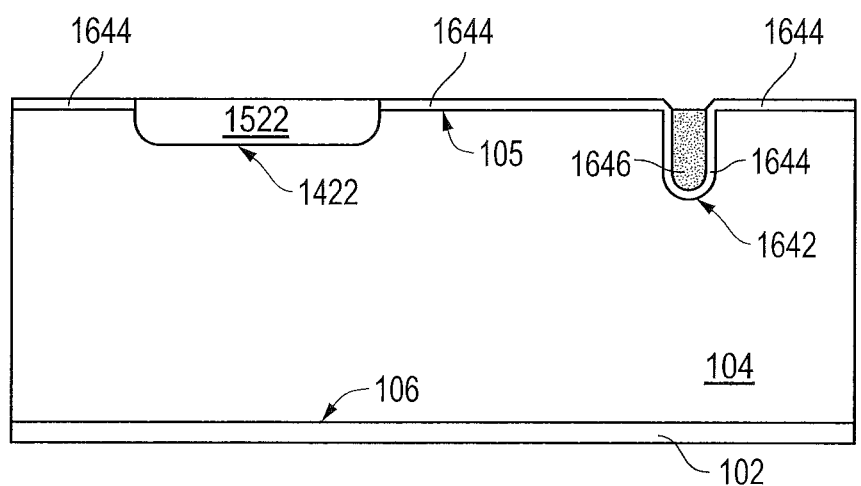
FIG. 17 includes an illustration of a cross-sectional view of the workpiece of FIG. 6 after forming a trench, a gate dielectric layer, and a gate electrode.

FIGS. 15 to 17 illustrate an embodiment where a sidewall masked isolation ("SWAMI") technique is used to form the electronic device. The process can begin with the workpiece as illustrated in FIG. 1. Referring to FIG. 15, a pad layer 1402 and an oxidation-resistant layer 1404 are formed over semiconductor layer 104 along the primary surface 105. The pad layer 1402 can include an oxide, such as an oxide thermally grown from the semiconductor layer 104, and the oxidation-resistant layer 1404 can include a nitride. The layers 1402 and 1404 are patterned, and a portion of the semiconductor layer 104 is removed to define a trench 1422, which in an embodiment, an isotropic silicon etch is used which has about one half of the depth of the trench 322. For example, if the trench 322 would have had a depth of 3 microns, the trench 1422 has a depth of 1.5 microns. The trench 1422 can be formed by isotropically etching the semiconductor layer 104, so that a portion of the oxidation-resistant layer 1404 is undercut during the etch.

After forming the trench 1422, another oxidation-resistant layer 1444 is formed over the workpiece. The oxidation-resistant layer 1444 can be conformally deposited over the oxidation-resistant layer 1404 and within the trench 1422. In an embodiment, the oxidation-resistant layer 1444 includes a nitride and may have the same composition as the oxidation-resistant layer 1404. The oxidation-resistant layer 1444 is anisotropically etched to remove the oxidation-resistant layer 1444 along the bottom of the trench 1422 to expose the semiconductor layer 104. The portions of the oxidation-resistant layer 1444 along the side and underlying the oxidation resistant layer 1404 remain after the etch.

The exposed portion of the semiconductor layer 104 within the trench 1422 is thermally oxidized to form the insulating region 1522 in FIG. 16. During the thermal oxidation, a portion of the semiconductor layer 104 is consumed. The targeted oxide thickness is approximately double the depth of the trench 1422 as originally formed. When 3 microns of oxide is thermally grown, the bottom of the insulating region 1522 lies at an elevation that is about 3 microns from the primary surface 105. After the insulating region is formed, residual portions of the oxidation resistant layers 1404 and 1444 are removed.

Processing can be continued with the doping steps as described and illustrated in FIG. 2. The trench 342 for the gate electrode can be formed as described with respect to FIG. 3. When the trench 342 is formed, the insulating region 1522 is protected, and the trench 322 is not formed. The remainder of the processing can be continued using any of the embodiments as previously described.

In another embodiment, the gate structure may be performed before forming the doped regions along or near the primary surface 105. FIG. 17 includes an illustration corresponding to an alternative embodiment in which the gate structure is formed before the doped regional along or near the primary surface 105.

A hardmask layer (not illustrated) can be formed over the workpiece and patterned to define an opening that corresponds to a location where a gate trench is to be formed. The semiconductor layer can be etched to define the trench 1642. A sacrificial oxide layer can be formed by thermally oxidizing the semiconductor layer 104. The hardmask layer, sacrificial oxide layer, and any remaining portion of the pad layer 1402 are removed.

A gate dielectric layer 1644 is formed over exposed portions of the semiconductor layer 104. The gate dielectric layer 1644 can include any of the materials and have any of the thicknesses as previously described with respect to the gate dielectric layer 442. A gate electrode layer can be formed over the gate dielectric layer 442. The gate electrode layer can include any of the materials and have any of the thicknesses as previously described with respect to the gate electrode layer 444. Parts of the gate electrode layer are removed to form a gate electrode 1646 within the trench 1642. The removal of parts of gate electrode layer to form the gate electrode 1646 can be performed using any of the techniques as previously described when forming the gate electrode 542.

Subsequent processing can be performed generally as previously described. The termination doped region 222, the body region 242, and link region 244 can be formed. The edge and active vertical regions 822 and 842 can be formed. Processing starting with the formation of the active regions 822 and 842 can be substantially the same as any of the embodiments as previously described.

For the embodiments described and illustrated, the timing of forming the relatively shallow trenches within the termination region, trenches for the gate structures, and forming doped regions near the primary surface may depend on how the insulating layer is formed within the relatively shallow trenches (for example, trenches 322 and 1422). When the insulating layer within the relatively shallow trenches is substantially completely thermally grown (for example, thermally oxidized), the doping operations may not be performed until after the thermal growth is completed. If the insulating layer within relatively shallow trenches is not thermally grown or less than half of the insulating layer is thermally grown, then forming the relatively shallow trenches, forming trenches for the gate structures, and forming the doped regions can be performed in any order.

Embodiments as described herein can allows for a better long term operation of the electronic device because a field electrode extends further into the termination region, and thus, less charge accumulates within the semiconductor layer 104 between the vertical regions 822 and 842. Furthermore, the insulating region 322 can allow for distribution of an electrical field within a termination region of an electronic device that includes a power transistor. For a particular $BV_{DSS}$, a smaller termination region may be used. In a particular embodiment, the area of the termination region may be reduced by more than 50% compared to conventional designs. For a particular area of the termination region, a larger voltage difference between $V_S$ and $V_D$ can be sustained, and thus, the electronic device may be able to sustain a larger overvoltage before a breakdown occurs.

The process of forming the structure for the termination region can be integrated with a process flow for making a transistor structure within the electronic component region. For example, the trench within the termination region can be formed using the same process sequence for forming a trench of a gate electrode for the transistor structure. Thus, an additional process operation may not be required. In addition, the trench for the structure in the termination region allows for a more planar electronic device to be formed.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include an electronic component region and a termination region adjacent to the electronic component region. The termination region includes a substrate; a vertical region overlying the substrate; and a semiconductor layer having a thickness, a primary surface and an opposite surface; and an insulating region that extends a depth into the semiconductor layer, wherein the depth is less than 50% of the thickness of the semiconductor layer. The semiconductor layer overlies the substrate, and the substrate is closer to the opposite surface than the primary surface.

Item 2. The electronic device of Item 1, wherein the substrate includes a buried conductive region, and the semiconductor layer includes a buffer layer and a lightly doped layer. The buffer layer is disposed between the buried conductive layer and the lightly doped layer and has a concentration between concentrations of the buried conductive region and the lightly doped layer.

Item 3. The electronic device of Item 1, wherein the substrate includes a buried conductive region has a first conductivity type, and the vertical region includes a doped vertical region having a second conductivity type opposite the first conductivity type, wherein the doped vertical region electrically floats.

Item 4. The electronic device of Item 1, wherein the substrate includes a buried conductive region has a first conductivity type, and the vertical region includes a doped vertical region having the first conductivity type, wherein the doped vertical region overlies and is electrically connected to the buried conductive region.

Item 5. The electronic device of Item 1, further including a field electrode overlying the semiconductor layer and the insulating region.

Item 6. The electronic device of Item 5, further including a vertical region overlying the substrate, wherein from a top view, the semiconductor layer within the termination region is disposed between the vertical region and the electronic component region.

Item 7. The electronic device of Item 6, wherein from a top view, the field electrode extends 30% to 80% of a distance from the electronic component region to the vertical region.

Item 8. The electronic device of Item 5, wherein each of the field electrode and the insulating region has an edge closest to the vertical region, and from a top view, the pillar is closer to the edge of the insulating region than to the edge of the field electrode.

Item 9. The electronic device of Item 5, further including a molding compound overlying the field electrode.

Item 10. The electronic device of Item 1, further including a doped region having a conductivity type opposite of the semiconductor layer, wherein the doped region is disposed between the electronic component region and the insulating region within the termination region.

Item 11. The electronic device of Item 10, wherein the doped region has a depth extending from the primary surface of the semiconductor layer, wherein the depth of the doped region is in a range of 50% to 99% of the depth of the insulating region.

Item 12. The electronic device of Item 10, further including a body region that is within the electronic component region and has a depth less than the doped region.

Item 13. The electronic device of Item 1, wherein only the semiconductor layer, and not a doped region within the semiconductor layer, is disposed along the primary surface between the insulating regions and the electronic component region.

Item 14. The electronic device of the Item 1, further including an insulating layer that is disposed between the field electrode and each of the insulating region and a portion of the semiconductor layer disposed between the insulating region and the electronic component region.

Item 15. The electronic device of Item 1, further including a body region and a body contact region, wherein the field electrode is electrically connected to the body contact region.

Item 16. An electronic device can include an electronic component region and a termination region adjacent to the electronic component region. The termination region includes a substrate; a semiconductor layer having a thickness, a primary surface and an opposite surface, wherein the semiconductor layer overlies the substrate, and the substrate is closer to the opposite surface than the primary surface; a first insulating region that extends a first depth into the semiconductor layer; and a second insulating region that extends a second depth into the semiconductor layer, wherein the second depth is less than the first depth. The electronic device can further include a field electrode overlying the semiconductor layer, the first insulating region, and the second insulating region.

Item 17. The electronic device of Item 16, wherein the first depth is in a range of 2 to 5 times greater than the second depth.

Item 18. The electronic device of Item 16, wherein the second insulating region has a width that is in a range of 5% to 30% of a width of the first insulating region.

Item 19. An electronic device can include an electronic component region and a termination region adjacent to the electronic component region. The termination region includes a substrate including a buried conductive region having a first conductivity type; a vertical region overlying the buried conductive region and including a vertical doped region having the first conductivity type and electrically connected to the buried conductive region; a semiconductor layer having a thickness, a primary surface and an opposite surface. The semiconductor layer overlies the buried conductive region; the semiconductor layer has the first conductivity type and directly contacts the vertical doped region; and the buried conductive region is closer to the opposite surface than the primary surface. The termination region further includes an insulating region that extends a depth into the semiconductor layer, wherein the depth is less than 50% of the thickness of the semiconductor layer; a doped region having a second conductivity type opposite of the first conductivity type, wherein the doped region is disposed between the electronic component region and the insulating region within the termination region; and a vertical region overlying the substrate, wherein the semiconductor layer within the termination region is disposed between the vertical region and the electronic component region. The electronic device further includes a field electrode overlying the semiconductor layer and the insulating region; and a molding compound overlying the field electrode, the insulating region, and the semiconductor layer.

Item 20. The electronic device of Item 19, wherein the field electrode extends 30% to 80% of a distance from the electronic component region to the vertical region.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   an electronic component region; and
   a termination region adjacent to the electronic component region and including:
      a substrate including a buried conductive region having a first conductivity type;
      a vertical region overlying the substrate, wherein the vertical region includes a doped vertical region having the first conductivity type, and wherein the doped vertical region overlies and is electrically connected to the buried conductive region;
      a semiconductor layer having a thickness, a primary surface and an opposite surface, wherein:
         the semiconductor layer overlies the substrate; and
         the substrate is closer to the opposite surface than the primary surface; and
      an insulating region that extends a depth into the semiconductor layer, wherein the depth is less than 50% of the thickness of the semiconductor layer.

2. The electronic device of claim 1, wherein:
   the substrate includes a buried conductive region; and
   the semiconductor layer includes a buffer layer and a lightly doped layer, wherein the buffer layer is disposed between the buried conductive layer and the lightly doped layer and has a concentration between concentrations of the buried conductive region and the lightly doped layer.

3. The electronic device of claim 1, wherein:
   the substrate includes a buried conductive region has a first conductivity type; and
   the vertical region includes a doped vertical region having a second conductivity type opposite the first conductivity type, wherein the doped vertical region electrically floats.

4. The electronic device of claim 1, further comprising a doped region disposed immediately adjacent to the insulating region, wherein a peak doping concentration of the doped region is in a range of 0.5 to 1.5 orders of magnitude higher than the semiconductor layer.

5. The electronic device of claim 1, further comprising a field electrode overlying the semiconductor layer and the insulating region.

6. The electronic device of claim 5, further comprising a vertical region overlying the substrate, wherein from a top view, the semiconductor layer within the termination region is disposed between the vertical region and the electronic component region.

7. The electronic device of claim 6, wherein from a top view, the field electrode extends 30% to 80% of a distance from the electronic component region to the vertical region.

8. The electronic device of claim 5, wherein each of the field electrode and the insulating region has an edge closest to the vertical region, and from a top view, the pillar is closer to the edge of the insulating region than to the edge of the field electrode.

9. The electronic device of claim 5, further comprising a molding compound overlying the field electrode.

10. The electronic device of claim 1, further comprising a doped region having a conductivity type opposite of the semiconductor layer, wherein the doped region is disposed between the electronic component region and the insulating region within the termination region.

11. The electronic device of claim 10, wherein the doped region has a depth extending from the primary surface of the semiconductor layer, wherein the depth of the doped region is in a range of 50% to 99% of the depth of the insulating region.

12. The electronic device of claim 10, further comprising a body region that is within the electronic component region and has a depth less than the doped region.

13. The electronic device of claim 1, wherein only the semiconductor layer, and not a doped region within the semiconductor layer, is disposed along the primary surface between the insulating region and the electronic component region.

14. The electronic device of the claim 5, further comprising an insulating layer that is disposed between the field electrode and each of the insulating region and a portion of the semiconductor layer disposed between the insulating region and the electronic component region.

15. The electronic device of claim 5, further comprising a body region and a body contact region, wherein the field electrode is electrically connected to the body contact region.

16. An electronic device comprising:
an electronic component region;
a termination region adjacent to the electronic component region and including:
a substrate;
a semiconductor layer having a thickness, a primary surface and an opposite surface, wherein the semiconductor layer overlies the substrate, and the substrate is closer to the opposite surface than the primary surface;
a first insulating region that extends a first depth into the semiconductor layer; and
a second insulating region that extends a second depth into the semiconductor layer, wherein the second depth is less than the first depth; and
a field electrode overlying the semiconductor layer, the first insulating region, and the second insulating region.

17. The electronic device of claim 16, wherein the first depth is in a range of 2 to 5 times greater than the second depth.

18. The electronic device of claim 16, wherein the second insulating region has a width that is in a range of 5% to 30% of a width of the first insulating region.

19. An electronic device comprising:
an electronic component region;
a termination region adjacent to the electronic component region and including:
a substrate including a buried conductive region having a first conductivity type;
a vertical region overlying the buried conductive region and including a vertical doped region having the first conductivity type and electrically connected to the buried conductive region;
a semiconductor layer having a thickness, a primary surface and an opposite surface, wherein:
the semiconductor layer overlies the buried conductive region;
the semiconductor layer has the first conductivity type and directly contacts the vertical doped region; and
the buried conductive region is closer to the opposite surface than the primary surface;
an insulating region that extends a depth into the semiconductor layer, wherein the depth is less than 50% of the thickness of the semiconductor layer;
a doped region having a second conductivity type opposite of the first conductivity type, wherein the doped region is disposed between the electronic component region and the insulating region within the termination region; and
a vertical region overlying the substrate, wherein the semiconductor layer within the termination region is disposed between the vertical region and the electronic component region;
a field electrode overlying the semiconductor layer and the insulating region; and
a molding compound overlying the field electrode, the insulating region, and the semiconductor layer.

20. The electronic device of claim 19, wherein the field electrode extends 30% to 80% of a distance from the electronic component region to the vertical region.

* * * * *